United States Patent
Morton et al.

(12) 
(10) Patent No.: US 6,628,167 B1
(45) Date of Patent: Sep. 30, 2003

(54) LINEARIZED FOLDING AMPLIFIER

(75) Inventors: Susan Morton, Newbury Park, CA (US); Albert Cosand, Agoura Hills, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/278,956

(22) Filed: Oct. 23, 2002

(51) Int. Cl.[7] .................. H03F 3/45; H03F 3/217; H03F 1/02; H03K 5/00; H03M 1/12
(52) U.S. Cl. .................. 330/252; 330/251; 330/9; 327/97; 341/155
(58) Field of Search .................. 330/252, 251, 330/9, 261, 207 A; 327/97; 341/155

(56) References Cited

U.S. PATENT DOCUMENTS

| | | | |
|---|---|---|---|
| 3,848,195 A | * 11/1974 | Kiko | 330/261 |
| 4,340,866 A | * 7/1982 | Metz | 330/254 |
| RE31,545 E | 3/1984 | Quinn | |
| 4,599,602 A | 7/1986 | Matzuzawa et al. | |
| 4,862,102 A | * 8/1989 | LaVoie | 330/256 |
| 5,554,943 A | 9/1996 | Moreland | |
| 5,684,419 A | 11/1997 | Murden et al. | |
| 6,069,579 A | * 5/2000 | Ito et al. | 341/156 |
| 6,163,290 A | * 12/2000 | Moreland et al. | 341/155 |

OTHER PUBLICATIONS

A 3.2–GHz Second–Order Delta–Sigma Modulator Implemented in InP HBT Technology; Jensen, J.F.; Raghavan, G.; Cosand, A.E., Walden, R.H.; IEEE Journal of Solid–State Circuits, vol. 30, No. 10, Oct. 1995.

An 8b 150MSample/s Serial ADC; Moreland, Carl W.; IEEE Internationa Solid–State Circuits Conference, Oct. 1995.

* cited by examiner

*Primary Examiner*—Patricia Nguyen
(74) *Attorney, Agent, or Firm*—Terje Gudmestad

(57) ABSTRACT

A linearized folding amplifier circuit (30) includes a comparator (40) that has a first state and a second state, and a switched output circuit that has a pair of outputs. The non-linearity in the response of a differential transistor pair to an input signal is partially linearized by a first resistor connecting the emitters of the two input transistors. The input is further linearized in response to the first and second state-controlling pairs of transistors and a differential error voltage therebetween that is replicated from the differential error in the base-voltages emitter voltages of the input differential pair. The output of the circuit is the combination of the partially linearized portion from the first resistor and a linearized transconductor circuit that has an output formed in response to the differential error.

10 Claims, 2 Drawing Sheets

LINEARIZED FOLDING AMPLIFIER

TECHNICAL FIELD

The present invention relates generally to an analog-to-digital converter, and more particularly to a folding amplifier circuit for an analog-to-digital converter.

BACKGROUND ART

Analog-to-digital converters are commonly used in aerospace and other applications. In aerospace applications, in particular, it is typically desirable to reduce power consumption and weight of the various components. Such weight and power reductions reduce the amount of fuel required for the particular aerospace application.

Folding amplifiers used for analog-to-digital converters are known. The output of folding amplifiers when used for an analog-to-digital converter must be linearized. Traditional methods for linearizing such a circuit use an additional pre-distortion or post-distortion stage. U.S. Pat. No. 4,599,602 describes a folding amplifier and serial analog-to-digital architecture. A linearization technique is used that requires a high supply voltage due to the additional voltage required by additional diodes used in the linearization. As a result an increased sized power supply must be provided.

Folding converters utilizing a parallel folding scheme typically require up to $2^n$ parallel folding amplifiers for an n-bit converter. Thus, for a 6-bit converter 64 folding amplifiers may be required. Such a design may be simplified by combining lower order folding cells with an interpolation circuit to obtain the remaining quantization levels. However, interpolation often requires an additional encoding circuit which can increase the complexity of the circuit.

A serial folding mechanism is also known. One such serial folding mechanism is described in "An 8b 150Msample/s Serial ADC" published in 1995 by C. W. Moreland. The initial signal is folded by using a folding amplifier. The result of the fold is then folded a second time by a subsequent folding amplifier and so on until there are n-1 folds in the waveform for an n-bit converter. The number of folding amplifiers, therefore, has decreased from $2^n$ to n−1 for an n-bit converter. However, the serial nature of such configurations requires accurate linearity for each folding amplifier. Another technique is to add a post-distorted preamplifier to the folding circuit. However, each of these techniques requires additional power for the circuit.

It would therefore be desirable to provide a linearization technique for a folding amplifier that minimally affects the power associated with such a circuit.

SUMMARY OF THE INVENTION

The present invention provides a folding amplifier architecture with a voltage to current converter linearization technique.

In one aspect of the invention, a linearized folding amplifier circuit includes a comparator that has a first state and a second state, and a switched output circuit that has a pair of outputs. The response of a pair of input transistors is partially linearized by a first resistor connecting the emitters of the two input transistors. The input is further linearized in response to the first and second state-controlling pairs of transistors and a differential error voltage therebetween. The output of the circuit is the combination of the partially linearized portion from the first resistor and the output of a linearized transconductor circuit that has been formed in response to the differential error.

The folding amplifier circuit described above may be included in an analog-to-digital converter.

In a further aspect of the invention, a method of operating a folding amplifier circuit comprises generating output signals from a control circuit in a first state and a second state. In response to the first and second states, a switched output transconductance circuit having a first input transistor pair receiving a first differential input signal is controlled. A first resistor is connected between the emitters of the first input differential pair. A first pair of output transistors having a first transistor and a second transistor and a second pair of output transistors having a third transistor and a fourth transistor are also included in the transconductance circuit. The linear transconductor portion has a third pair of output transistors having a fifth transistor and a sixth transistor and a fourth pair of output transistors having a seventh transistor and an eighth transistor. The third pair is coupled to the first pair and the fourth pair is coupled to the second pair. The linear transconductor portion has a fifth pair of transistors having a ninth transistor and a tenth transistor each having an emitter coupled to a second resistor.

In a first state, a first differential error signal is generated between the first and fourth transistors which corresponds to the error between the transistors of the input differential pair. The first differential error signal is coupled to the linear transconductor portion through the fifth and eighth transistors. The linearized transconductor portion generates a first pair of linearized outputs in response to the first differential error signal and the differential input signal.

A second state is generated by a switching of the control circuit which may be a comparator circuit, such that each of its complementary outputs reverses polarity. In this second state, a second differential error signal is generated between the second and third transistors which corresponds to an error between the transistors of the input differential pair. The second differential error signal is coupled to the linear transconductor portion through the sixth and seventh transistors. The linearized transconductor portion generates a second pair of linearized outputs in response to the second differential error signal and the differential input signal.

One advantage of the invention is that the folding amplifier output exhibits higher linearity than known pre or post-distortion circuits. Further, no extra stage for linearization is included. Although a small number of additional transistors are required, less power is consumed by the circuit than other known techniques. Thus, the performance of an analog-to-digital circuit, in which the linearity of the folding amplifier is directly related to the performance of the converter, is improved.

Other aspects and advantages of the present invention will become apparent upon the following detailed description and appended claims, and upon reference to the accompanying drawings.

BEST MODES FOR CARRYING OUT THE INVENTION

Figure 1:
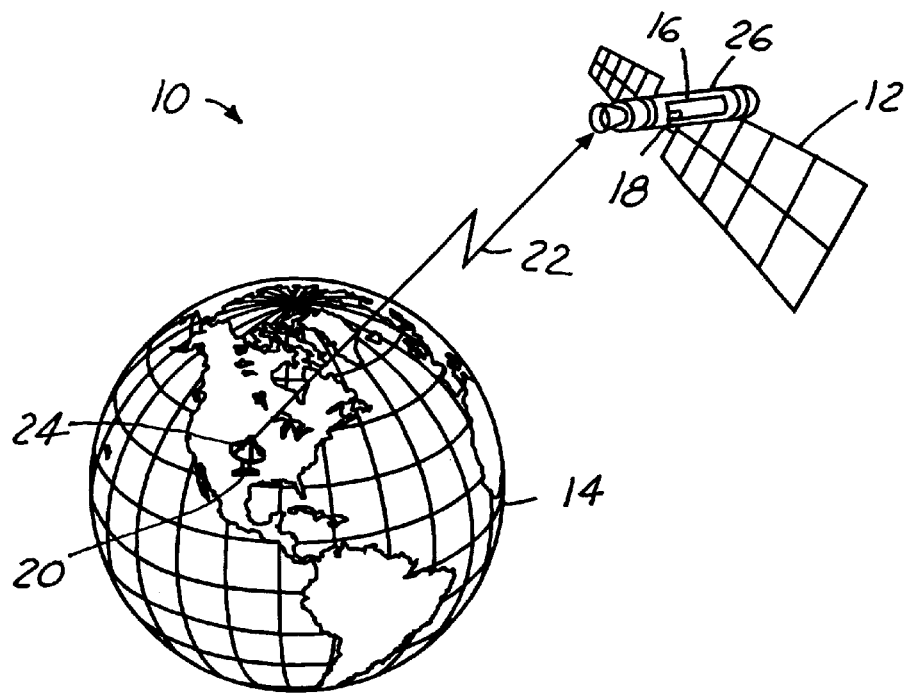
FIG. 1 is a perspective view of a satellite system incorporating an analog-to-digital converter according to the present invention.

In the following figures the same reference numerals will be used to identify the same components. The present invention is described with respect to a folding amplifier for an analog-to-digital converter. Those skilled in the art will recognize that the folding amplifier may be us e d for other applications in a aerospace and non-aerospace applications (e.g., radar systems).

Referring no w to FIG. 1, a communication system 10 is illustrated with respect to a satellite 12 positioned above earth 14. Satellite 12 has a telemetry tracking and control system 16 that incorporates a n analog-to-digital converter 18 according to th e present invention. Telemetry tracking and control circuit 16 is used to communicate with a gateway station 20 positioned on earth 14. Communication signals 22 are thus exchanged between gateway station 20 and satellite 12 through respective antennas 24, 26.

Figure 2:
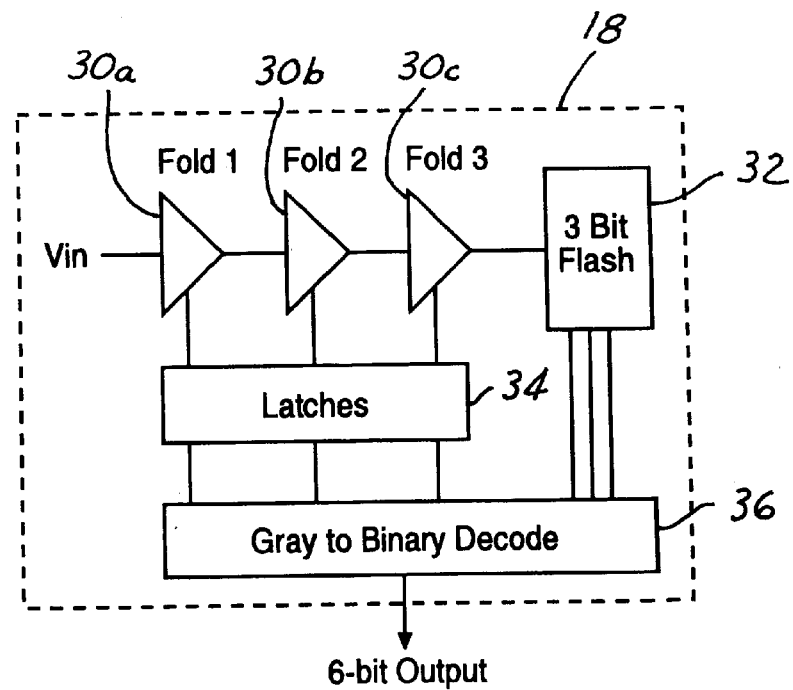
FIG. 2 is a schematic view of a serial folding architecture analog-to-digital converter employing a folding amplifier according to the present invention.

Referring now to FIG. 2, analog-to-digital converter 18 is illustrated in further detail. Analog-to-digital converter 18 includes a plurality of folding amplifiers 30. Folding amplifiers 30 are illustrated positioned serially. That is, the output of one folding amplifier is connected to the input of an adjacent folding amplifier. Although three folding amplifiers are illustrated, more than three amplifiers may be used depending on the required bit size of the output of the analog-to-digital converter. The first of the cascaded folding amplifiers has a voltage input Vin. The output of the third folding amplifier 30C is coupled to a 3-bit flash quantizer circuit 32. Folding amplifiers 30A, 30B, and 30C are coupled to latches 34. It should be noted that the inputs to folding amplifiers is a differential voltage (Vin$^+$, Vin$^-$). Each folding amplifier 30A–30C produces a folded differential analog output signal for the next stage. The folding amplifier outputs are latched by latches 34 along with the output of 3-bit flash quantizer circuit 32 at the end of the clock period. The output of the folding amplifier produces gray-coded output data. The gray to binary decoder 36 is used to convert the gray code to binary code. As would be evident to those skilled in the art, because of the serial nature of the present invention, it is important to linearize the output of the folding amplifiers.

Figure 3:
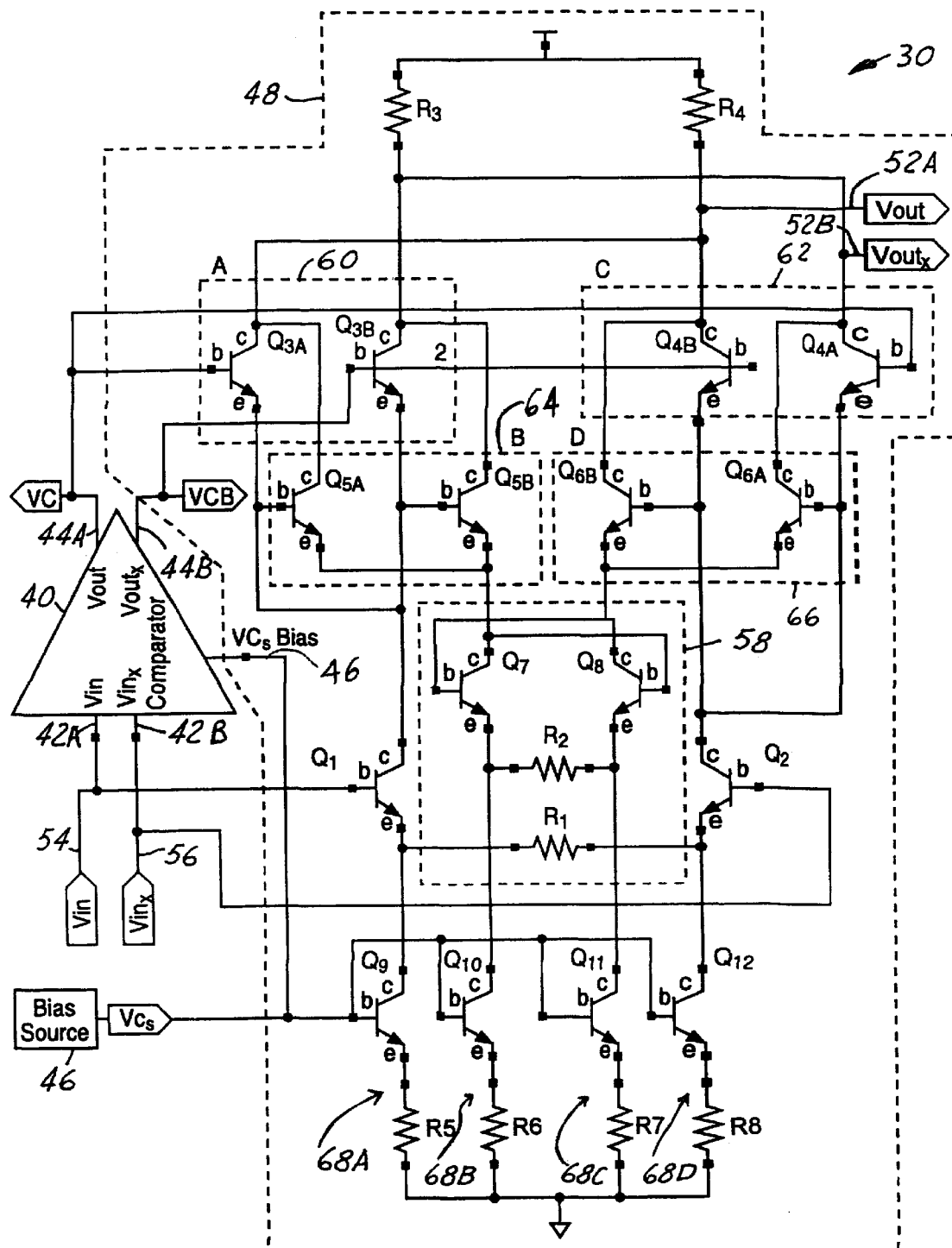
FIG. 3 is a schematic view of a folding amplifier according to the present invention.

Referring now to FIG. 3, a folding amplifier circuit 30 is illustrated. The folding amplifier circuit 30 generally has a comparator circuit 40 that has an input 42A and an inverted input 42B. Comparator 40 has an output 44A and an inverted output 44B. Comparator 40 also has a biasing input 46 coupled to a bias voltage source 46. The folding amplifier circuit also includes a switched output circuit 48. Switched output circuit 48 receives the outputs 44A and 44B from comparator circuit 40 and generates an output 52A and inverted output 52B. The switched output circuit 48 has a first pair of input transistors Q1 and Q2. Q1 receives a voltage from voltage source Vin, which is also coupled to the input 42A of comparator 40. Transistor Q2 is coupled to the inverted input Vin$_x$ 56. Each of the transistors described in the present application has a base b, an emitter e, and a collector c. In the present example, the base of transistors Q1 and Q2 is coupled to voltage sources 54 and 56, respectively. The present circuit seeks to linearize the output, the nonlinearity of which is caused by the base to emitter distortion of the first and second input transistors Q1 and Q2. The input transistors Q1 and Q2 are generally connected to a linear transconductor circuit portion 58, a first pair of output transistors 60, a second pair of output transistors 62, a third pair of output transistors 64, and a fourth pair of output transistors 66. Each pair of output transistors 60–66 is designed such that when one transistor is on or conducting the other transistor is off or non-conducting. The first pair of output transistors is Q3A and Q3B. The second pair of output transistors 62 has transistors Q4A and Q4B. The third set of output transistors 64 includes transistors Q5A and Q5B. The fourth pair of transistors includes transistors Q6A and Q6B.

Linear transconductor circuit portion 58 includes transistor Q7 and Q8. Also, resistors R1 and R2 are positioned within transconductance circuit 58. In addition, a pair of pull up resistors is coupled to the first pair of transistors 60 and the second pair of transistors 62 as R3 and R4.

A plurality of current sources 68A, 68B, 68C, and 68D are positioned within transistor output transconductance circuit 48. Each of the current sources 68A, 68B, 68C, and 68 has a resistor R5, R6, R7, and R8 and an associated transistor Q9, Q10, Q11 and Q12, respectively. The base b of each transistor Q9, Q10, Q11 and Q12 is coupled to bias source input 46. Current source 68A (collector of Q9) is coupled to input transistor Q1. Current source 68B and 68C (collector of Q10 and Q11) are coupled to transconductor circuit portion 58. Current source 68D (collector of Q12) is coupled to the second input transistor Q2. Of course, other types of current sources (other ways to bias the circuit) may be used including splitting R1 into two series resistors, each of value R1/2, and a single current source supplying the same total current as 68B and 68C is connected to the midpoint of the two resistors.

The following is a more detailed description of the interconnections of the circuitry. The output 44A is coupled to the bases of transistors Q3A and Q4A. The inverted output 44B is coupled to the bases of transistors Q3B and Q4B. The collector of transistor Q3A is coupled to output 52A. The collector of transistor Q4A is coupled to the output 52B. The collector of transistor Q4A is also coupled to resistor R3. The collector of transistor Q3A is coupled to resistor R4. The emitter of transistor Q3A is coupled to the base of transistor Q5A and to the collector of transistor Q1 . The collector of transistor Q4A is coupled to the collector of transistor Q2 and the base of transistor Q6A.

The transistor Q4A has a collector that is coupled to resistor R3 and to the collector of transistor Q5B. The emitter of transistor Q3B is coupled to the base of transistor Q5B and the collector of transistor Q1 . The collector of transistor Q4B is coupled to resistor R4 and the collector of transistor Q6B. The emitter of transistor Q4B is coupled to the base of transistor Q6B and the collector of transistor Q2. The emitter of transistor Q5A is coupled to the emitter of transistor Q5B, which in turn is coupled to the collector of transistor Q7. The emitter of transistor Q6A is electrically coupled to the emitter of transistor Q6B and to the collector of transistor Q8. The collector of transistor Q7 is coupled to the base of transistor Q8. The collector of transistor Q8 is coupled to the base of transistor Q7. Thus, the transistors Q7 and Q8 are cross-coupled. The emitter of transistor Q7 is coupled to resistor R2 and to current source 68B. The emitter of transistor Q8 is coupled to resistor R2 and to current source 68C. That is, the emitter of transistor Q7 is coupled to the collector of transistor Q10 while the emitter of transistor Q8 is coupled to the collector of transistor Q11. The bases of transistors Q9, Q10, Q11, and Q12 are coupled to the bias source 46. The emitters of Q9, Q10, Q11, and Q12 are coupled to ground through resistors R5, R6, R7, and R8, respectively.

The emitters of transistors Q1 and Q2 are coupled to the collectors or transistors Q9 and Q12, respectively, and to resistor R1. Preferably, resistors R1 and R2 are matched. That is, each of the resistors has the same resistance.

In operation, the comparator output governs which of each of the pairs of transistors are active in the circuit. When the output 44A of comparator 40 is high, Q3A, Q4A, Q5A, and Q6A are active. Q3B, Q4B, Q5B, and Q6B are not active. The input signals 54 and 56 are provided to the input transistors Q1 and Q2, respectively. The response of transistors Q1 and Q2 to the input signals is partially linearized by R1, and further linearized when the differential error voltage generated between the emitters of transistors Q3A and Q4A (or between emitters of Q3B and Q4B) is sensed by the linearized transconductor Q5A, Q6A, Q7, Q8, and R2 (or Q5B, Q6B, Q7, Q8, and R2). The output of this linearized transconductor is combined into the output 52A and 52B of the circuit as a whole. That is, Q1, Q2, and R1, biased by the current sources 68A and 68D, form a simple, somewhat nonlinear transconductor. (A transconductor provides an output current in response to an input voltage.) This needs to be linearized in order for the folding amplifier to be useful. The output of the transconductor is coupled either through Q3A and Q4A to the output load resistors R3 and R4 and respective output terminals Vout and Vout$_x$, or else through Q3B and Q4B to the outputs but with the opposite polarity, depending on the state of the comparator outputs. The nonlinearity of the transconductor Q1/Q2/R1 is due to the current-dependent difference in the base-to-emitter voltages of Q1 and Q2. Since the ratio of emitter currents in Q3 and Q4 is almost identically equal to the ratio of emitter currents in Q1 and Q2, and the emitter currents themselves in Q3 and Q4 are nearly equal to those in Q1 and Q2, and the bases of either set (A or B) of Q3 and Q4 are at the same voltage, the difference in voltage between the emitters of Q3 and Q4 corresponds quite precisely to the error in the relationship between input voltage and output current of the simple transconductor Q1/Q2/R1. If a second transconductor with transconductance of approximately 1/R1 is driven by the voltage difference between the emitters of Q3 and Q4, and its output current is summed in phase with the output current of the transconductor Q1/Q2/R1, the resultant transconductance (ratio of differential output current to differential input voltage) will be very nearly equal to 1/R1 and will be quite linear.

There are several possible circuits that may be used for the second transconductor that provides the error correction. The particular circuit used herein, Q5/Q6/Q7/Q8/R2 (where the values of R1 and R2 are the same) is used because it is readily adapted to the required switching finction through the use of Q5A, Q5B, Q6A, and Q6B. The simple, non-switching version of this circuit is known in prior art as Caprio's quad, as described by R. Caprio, "Precision differential voltage-current converter, " Electron. Lett., vol. 9, pp. 147–148, Febuary 1973. The use of Caprio's quad as the error-correcting transconductor in Quinn's circuit is described by Jensen et al, "A 3.2 GHz second-order delta-sigma modulator, "IEEE J. Solid-State Circuits, vol. 30, pp. 1119–1127, October 1995. An important feature of this invention is the addition of the polarity switching of the output of the linearized transconductor through the use of Q3A,B, Q4A,B, Q5A,B and Q6A,B, so that a folding amplifier with improved linearity can be realized.

While particular embodiments of the invention have been shown and described, numerous variations and alternate embodiments will occur to those skilled in the art. Accordingly, it is intended that the invention be limited only in terms of the appended claims.

What is claimed is:

1. A linearized folding amplifier circuit comprising:
a comparator circuit having a first state and a second state; and
a switched output transconductance circuit coupled to the comparator circuit, said switched output transconductance circuit having an input transconductor portion, said input transconductor portion having a differential pair of transistors with a first resistor connected between the emitters of the pair of transistors, said differential pair being driven by a differential input signal applied at the bases of the differential pair, a first pair of output transistors having a first transistor and a second transistor, a second pair of output transistors having a third transistor and a fourth transistor, a linear transconductor portion having a third pair of output transistors having a fifth transistor and a sixth transistor and a fourth pair of output transistors having a seventh transistor and an eighth transistor, said third pair coupled to said first pair and said fourth pair coupled to said second pair, said linear transconductor portion having a fifth pair of transistors having a ninth transistor and a tenth transistor each having an emitter coupled to a second resistor,
in a first state said switched output transconductance circuit generating a first differential error signal between emitters of said first and fourth transistors corresponding to the difference in the base-emitter voltages of the input pair of transistors, said first differential error signal coupled from said first and fourth transistors to said linear transconductor portion through said fifth and eighth transistors, said linear transconductor portion generating a first pair of linearized outputs in response to said first differential error signal,
in a second state said switched output transconductance circuit generating a second differential error signal between emitters of said second and third transistors corresponding to the difference in the base-emitter voltages of the input pair of transistors, said second differential error signal coupled from said second and third transistors to said linear transconductor portion through said sixth and seventh transistors, said linear transconductor portion generating a second pair of linearized outputs in response to said second differential error signal.

2. A circuit as recited in claim 1 wherein said comparator circuit has a first output and a complementary second output.

3. A circuit as recited in claim 1 further comprising a first pair of current sources coupled to said first input transistor and said second input transistor.

4. A circuit as recited in claim 1 wherein said first resistor and said second resistor comprise a matched pair of resistors.

5. A circuit as recited in claim 1 wherein said first pair of output transistors, said second pair of output transistors, said third pair of output transistors and said fourth pair of output transistors comprise matched transistors.

6. An analog-to-digital converter circuit comprising:
a plurality of serially connect folding amplifier circuits having an analog input;
a plurality of latches coupled to the folding amplifier circuits, said latches generating a gray code signal corresponding to said analog input; and
a flash quantizer circuit coupled to the plurality of folding amplifier circuit;
a gray to binary decoder coupled to the flash quantizer circuit and the plurality of latches, said latches generating a digital output in corresponding to the gray code signal,
said folding amplifiers comprising
a comparator circuit having a first state and a second state;

a switched output transconductance circuit coupled to the comparator circuit, said switched output transconductance circuit having an input transconductor portion, said input transconductor portion having a differential pair of transistors with a first resistor connected between the emitters of the pair of transistors, said differential pair being driven by a differential input signal applied at the bases of the differential pair, a first pair of output transistors having a first transistor and a second transistor, a second pair of output transistors having a third transistor and a fourth transistor, a linear transconductor portion having a third pair of output transistors having a fifth transistor and a sixth transistor and a fourth pair of output transistors having a seventh transistor and an eighth transistor, said third pair coupled to said first pair and said fourth pair coupled to said second pair, said linear transconductor portion having a fifth pair of transistors having a ninth transistor and a tenth transistor each having an emitter coupled to a second resistor, in a first state said switched output transconductance circuit generating a first differential error signal between emitters of said first and fourth transistors corresponding to the difference in the base-emitter voltages of the input pair of transistors, said first differential error signal coupled from said first and fourth transistors to said linear transconductor portion through said fifth and eighth transistors, said linear transconductor portion generating a first pair of linearized outputs in response to said first differential error signal, and in a second state said switched output transconductance circuit generating a second differential error signal between emitters of said second and third transistors corresponding to the difference in the base-emitter voltages of the input pair of transistors, said second differential error signal coupled from said second and third transistors to said linear transconductor portion through said sixth and seventh transistors, said linear transconductor portion generating a second pair of linearized outputs in response to said second differential error signal.

7. A circuit as recited in claim 6 wherein said flash quantizer circuit comprises a three bit flash quantizer circuit.

8. A method of operating a folding amplifier circuit comprising:

generating output signals from a control circuit in a first state and a second state; and in response to said first and second states, controlling a switched output transconductance circuit having a first input transistor receiving a first input signal and a second input transistor receiving a second input signal, a first resistor coupled between said first input transistor and said second input transistor, a first pair of output transistors having a first transistor and a second transistor, a second pair of output transistors having a third transistor and a fourth transistor, a linear transconductor portion having a third pair of output transistors having a fifth transistor and a sixth transistor and a fourth pair of output transistors having a seventh transistor and an eighth transistor, said third pair coupled to said first pair and said fourth pair coupled to said second pair, said linear transconductor portion having a fifth pair of transistors having a ninth transistor and a tenth transistor each having an emitter coupled to a second resistor, in a first state, generating a first differential error signal between emitters of said first and fourth transistors corresponding to the difference in the base-emitter voltages of the input pair of transistors, said first differential error signal coupled from said first and fourth transistors to said linear transconductor portion through said fifth and eighth transistors, said linear transconductor portion generating a first pair of linearized outputs in response to said first differential error signal, in a second state, generating a second differential error signal between emitters of said second and third transistors corresponding to the difference in the base-emitter voltages of the input pair of transistors, said second differential error signal coupled from said second and third transistors to said linear transconductor portion through said sixth and seventh transistors, said linear transconductor portion generating a second pair of linearized outputs in response to said second differential error signal.

9. A method as recited in claim 8 wherein generating said first state and said second state comprises generating said first state and said second state in response to an output of a comparator.

10. A method as recited in claim 8 when said comparator has a high output and low complementary output entering said first state; when said comparator has a low output and a high complementary output entering said second state.

\* \* \* \* \*